United States Patent
Cook et al.

(10) Patent No.: US 8,278,977 B2
(45) Date of Patent: Oct. 2, 2012

(54) REFRESH OPERATION DURING LOW POWER MODE CONFIGURATION

(75) Inventors: Thomas D. Cook, Austin, TX (US); Jeffrey C. Cunningham, Austin, TX (US); Karthik Ramanan, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 63 days.

(21) Appl. No.: 12/823,487

(22) Filed: Jun. 25, 2010

(65) Prior Publication Data

US 2011/0316592 A1 Dec. 29, 2011

(51) Int. Cl.
*H03L 7/00* (2006.01)

(52) U.S. Cl. .................... 327/143; 327/142; 327/198

(58) Field of Classification Search .......... 327/142, 327/143, 198
See application file for complete search history.

(56) References Cited

U.S. PATENT DOCUMENTS

| | | | |
|---|---|---|---|
| 5,465,367 A | 11/1995 | Reddy et al. | |
| 5,781,062 A * | 7/1998 | Mashiko et al. | 327/544 |
| 5,969,996 A * | 10/1999 | Muranaka et al. | 365/189.14 |
| 6,199,139 B1 * | 3/2001 | Katayama et al. | 711/106 |
| 7,672,182 B2 | 3/2010 | Park et al. | |
| 2004/0141396 A1 * | 7/2004 | Ting et al. | 365/222 |
| 2005/0212560 A1 * | 9/2005 | Hidaka | 326/83 |
| 2005/0286339 A1 * | 12/2005 | Parris et al. | 365/236 |
| 2007/0057696 A1 * | 3/2007 | Sakata et al. | 326/82 |
| 2007/0091664 A1 * | 4/2007 | Chow et al. | 365/145 |

* cited by examiner

*Primary Examiner* — Ryan Jager

(57) ABSTRACT

A target circuit of an electronic device is placed in a suspended mode by disconnecting the target circuit from one or more voltage sources. A refresh controller periodically initiates a refresh operation during the suspended mode by temporarily reconnecting the target circuit to the one or more voltage sources for a duration sufficient to recharge capacitances of the target circuit. The refresh controller terminates the refresh operation by disconnecting the target circuit from the one or more voltage sources, thereby continuing the suspended mode of the electronic device. The refresh controller can employ a Very Low Frequency Oscillator (VLFO) to time the frequency of refresh operations. The VLFO manages the refresh initialization timing based on the voltage across a capacitor that is selectively charged or discharged so as to implement the refresh operation. The refresh controller further can employ a counter to time the duration of the refresh operation.

20 Claims, 3 Drawing Sheets

REFRESH OPERATION DURING LOW POWER MODE CONFIGURATION

FIELD OF THE DISCLOSURE

The present invention relates generally to electronic devices and more particularly to low power mode configurations for electronic devices.

BACKGROUND

Electronic devices often employ a low power mode whereby certain circuitry is disabled by disconnecting the circuitry from a power source. However, the disabled circuitry often has parasitic capacitances that eventually discharge when the power source is removed for a sufficiently long period. These parasitic capacitances typically must be recharged when power is again applied before the circuitry can reach a quiescent point and thus be available for operation. Because the current available to recharge these parasitic capacitances typically is limited, the time required to reach the quiescent point can introduce a significant delay in converting the electronic device back to an operational mode from the low power mode.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

FIGS. 1-6 illustrate example techniques for enacting a low-power mode in an electronic device in a manner that permits relatively fast reactivation into an operational mode. In one embodiment, a target circuit of the electronic device is placed in a suspended mode by disconnecting or otherwise isolating the target circuit from one or more voltage sources. In order to facilitate a timely reversion back to an operational mode, a refresh controller of the electronic device periodically initiates a refresh operation during the suspended mode by temporarily reconnecting the target circuit to the one or more voltage sources for a duration sufficient to recharge the capacitances of the target circuit. The refresh controller terminates the refresh operation by disconnecting the target circuit from the one or more voltage sources, thereby continuing the suspended mode of the electronic device. Through this periodic refreshing of the charge in the capacitances of the target circuit while in suspended mode, the target circuit can more quickly be brought to a quiescent point following reentry into an operational mode.

In one embodiment, the refresh controller employs a Very Low Frequency Oscillator (VLFO) to time the frequency of refresh operations. The VLFO manages the refresh initialization timing based on the voltage across a capacitor that is selectively charged or discharged based on a state of the target device. The refresh controller further can employ a counter to time the duration of the refresh operation, whereby the counter is enabled or powered only during the refresh operation. In this configuration, the charging and discharging of the capacitor requires relatively little current, and thus the refresh controller can implement periodic refreshing of the target circuit while consuming relatively little power.

Figure 1:
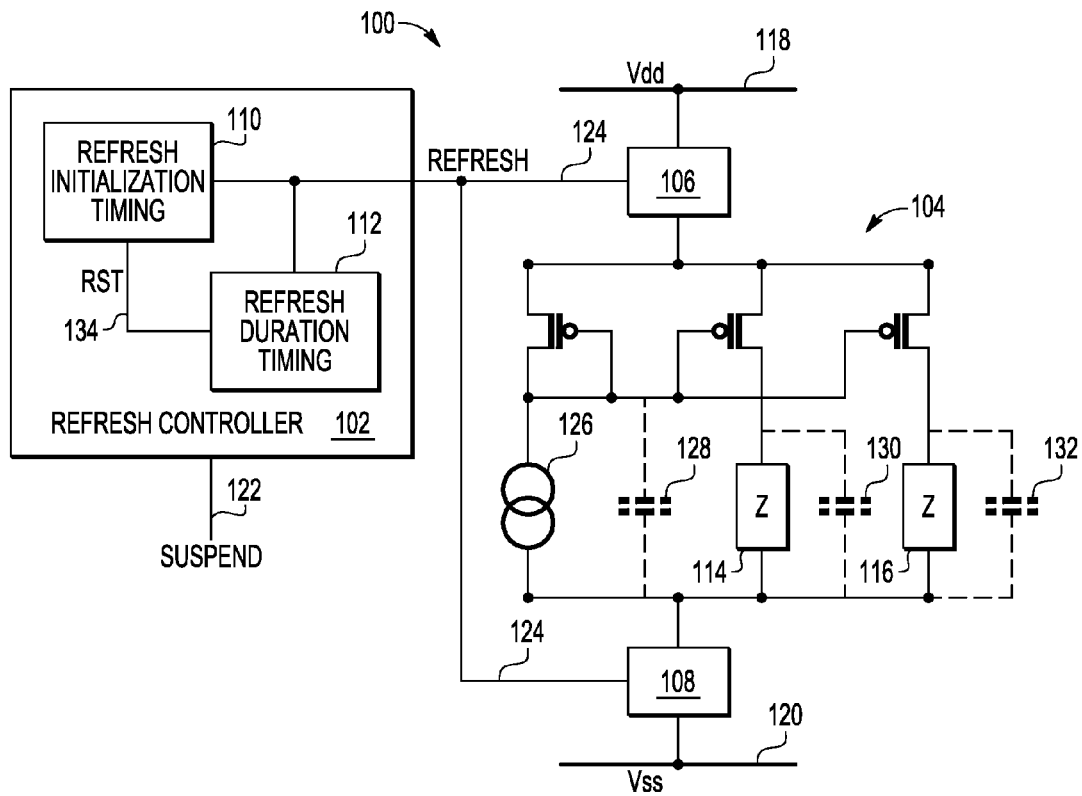
FIG. 1 is a diagram illustrating an electronic device employing a refresh controller to periodically refresh capacitances of a target during a low power or suspended mode in accordance with at least one embodiment of the present invention.

FIG. 1 illustrates an electronic device 100 having a low power mode with periodic capacitive charge refreshing in accordance with at least one embodiment of the present disclosure. The electronic device 100 includes a refresh controller 102, at least one target circuit 104, and one or more isolation switches, such as isolation switches 106 and 108. The refresh controller 102 includes a refresh initialization timing circuit 110 and a refresh duration timing circuit 112. In the depicted example, the target circuit 104 is illustrated as a current mirror circuit to drive a mirrored current for loads 114 and 116. Although FIG. 1 depicts an example of the target circuit 104 as a current mirror circuit for ease of illustration, the target circuit 104 can include any of a variety of circuits having capacitances, designed or parasitic, that require recharging before the target circuit can return to a quiescent point following a return from a suspended state as controlled by a state of a SUSPEND signal 122. The isolation switches 106 and 108 operate to selectively electrically connect or disconnect the target circuit 104 from a voltage source 118 (Vdd) and a voltage source 120 (Vss), respectively, based on the state of a REFRESH signal 124.

The target circuit 104 can be maintained in at least two modes through manipulation of the isolation switches 106 and 108: an operational, or full-power, mode (when the SUSPEND signal 122 is unasserted); and a suspended, or low-power, mode (when the SUSPEND signal 122 is asserted). In the operational mode, the isolation switches 106 and 108 are manipulated to electrically connect the voltage sources 118 and 120 to the target circuit. In the suspended mode, the isolation switches 106 and 108 are manipulated to electrically disconnect or isolate the target circuit 104 from the voltage sources 118 and 120, with the exception of during period refresh operations, as described below.

When the target circuit 104 is electrically disconnected from the voltage sources 118 and 120 during the suspended mode, the nodes within the target circuit 104 begin to discharge though various leakage paths. To illustrate, when the current mirror example of FIG. 1 is placed in the suspended mode, the current mirror circuit is disconnected from the voltage sources 118 and 122 and a current source 126 is electrically disconnected from the remainder of the current mirror circuit. As a result, the parasitic capacitance 128 in the current mirror circuit begins to discharge, as do the parasitic capacitances 130 and 132 of the loads 114 and 116. When the target circuit 104 is returned to the operational mode by reconnecting the voltage sources 118 and 120 and the current source 126 to the target circuit 104, the parasitic capacitances 128, 130, and 132 will need to be recharged before the target circuit 104 reaches a quiescent point and thus can begin normal operation. The time needed to for this recharge operation often introduces detrimental delay into the circuits that interact with or otherwise rely on the target circuit 104.

One approach to reducing the charging time of these capacitances when returning from a suspended mode is to increase the in-rush current. However, this increased current results in increased power consumption that is essentially wasted. Moreover, in many instances it may not be practicable to supply an increased current. Rather than rely on an increased in-rush current, the refresh controller 102 reduces or eliminates the delay caused by the recharging of the capacitances by periodically performing a refresh operation during the suspended mode of the target circuit 104. To initiate a refresh operation, the refresh controller 102 asserts the REFRESH signal 124, which in turn configures the isolation switches 106 and 108 so as to temporarily connect the target circuit 104 to the voltage sources 118 and 120. This temporary connection of the target circuit 104 to the voltage sources 118 and 120 permits the capacitances 128, 130, and 132 of the target circuit to recharge. As such, the capacitances 128, 130, and 132 of the target circuit 104 will be at least partially charged when the target circuit 104 returns to the operational mode from the suspended mode, thus requiring less time and current to bring the target circuit 104 to a quiescent point.

The refresh controller 102 employs the refresh initialization timing circuit 110 to time the initiation of each refresh operation during the suspended mode and employs the refresh duration timing circuit 112 to time the duration of each refresh operation. When in the suspended mode, the refresh initialization timing circuit 110 uses a timing mechanism to time the initiation of the next refresh operation. When it is time to initialize the next refresh operation, the refresh initialization timing circuit 110 asserts the REFRESH signal 124. While the REFRESH signal 124 is asserted, the isolation circuits 106 and 108 reconnect the target circuit 104 to the voltage sources 118 and 120. Further, the assertion of the REFRESH signal 124 causes a counter or other timing mechanism of the refresh duration timing circuit 112 to begin measuring an elapsed duration of the assertion of the REFRESH signal 124. When the elapsed duration of the assertion of the REFRESH signal 124 reaches an identified threshold (that is, when the refresh operation has been performed for a threshold duration), the refresh duration timing circuit 112 asserts a reset (RST) signal 134. The assertion of the RST signal 134 in turn causes the refresh initialization timing circuit 110 to deassert the REFRESH signal 124, thereby terminating the current refresh operation and initiating the timing for the next refresh operation. This timing cycle can be repeated until the SUSPEND signal 122 is deasserted, thereby taking the target circuit 104 from the suspended mode to the operational mode.

Figure 2:
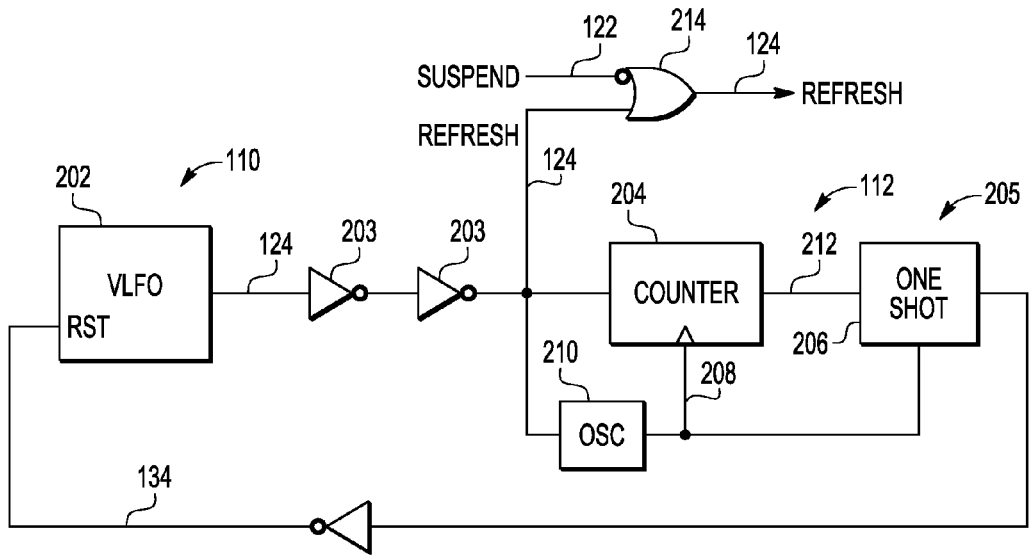
FIG. 2 is a diagram illustrating the refresh controller of FIG. 1 in greater detail in accordance with at least one embodiment of the present invention.

FIG. 2 illustrates an example implementation of the refresh controller 102 of the electronic device 100 of FIG. 1 in accordance with at least one embodiment of the present disclosure. The refresh initialization timing circuit 110 can employ a VLFO 202 to control the state of the REFRESH signal 124 based on the charging and discharging of a capacitor of the VLFO 202. In one embodiment, the refresh initialization timing circuit 110 can include a series of inverters 203 to square up the REFRESH signal 124 output by the VLFO 202.

The refresh duration timing circuit 112 employs a counter-based mechanism to control the duration that the REFRESH signal 124 is maintained in the asserted state for any given timing cycle. To illustrate, in the depicted example the refresh duration timing circuit 112 includes a counter 204 to time the duration of the refresh operation and a reset circuit 205 to reset the VLFO 202 when the counter reaches an identified counter threshold. The counter 204 includes an enable input to receive the REFRESH signal 124 as an enable signal, a timing input to receive a clock signal 208 from an oscillator 210, and an output to provide a counter value 212. In operation, the counter 204 responds to an assertion of the REFRESH signal 124 by initializing the count value 212 to an initial value and then incrementing or decrementing the count value 212 based on the clock signal 208. The counter 204 can include, for example, a ripple counter with a size based on the frequency of the clock signal 208 and the time required to refresh the capacitances of the target circuit 204. The oscillator 210 can include, for example, the main system oscillator for the electronic device 100 or any convenient clock generator.

In the depicted example, the reset circuit 205 includes a one-shot circuit 206 having an input to receive the count value 212, an input to receive the clock signal 208, and an output to control the reset signal 124. In operation, the one-shot circuit 206 generates a pulse in the reset signal 124 (or an inverted representation thereof) in response to the count value 212 reaching a predetermined threshold, wherein a duration of the pulse is based on the period of the clock signal 208.

When the electronic device 100 is placed into a suspended mode, the VFLO 202 initiates a flow of current to the capacitor, thereby initiating charging of the capacitor. While the voltage across the capacitor does not exceed the threshold voltage, the VLFO 202 maintains the REFRESH signal 124 in an unasserted state. However, when the voltage across the capacitor exceeds the threshold voltage, the VLFO 202 asserts the REFRESH signal 124 and maintains this signal in the asserted state. The assertion of the REFRESH signal 124 enables the counter 204, which in turn begins modifying the count value 212 based on the clock signal 208. When the count value 212 reaches the threshold value, the one-shot circuit 206 generates a pulse in the RST signal 134. This pulse triggers the VLFO 202 to begin discharging the capacitor. When the voltage across the capacitor no longer exceeds the threshold voltage, the VLFO 202 deasserts the REFRESH signal 124 and maintains the REFRESH signal 124 in this unasserted state. The deassertion of the REFRESH signal 124 places the counter 204 into a disabled state, thereby reducing the power consumed by the counter 204 and the one-shot circuit 206 until the next refresh operation is initiated.

In one embodiment, the state of the REFRESH signal 124 is further controlled based on the state of the SUSPEND signal 122. To illustrate, the refresh controller 102 can employ a logic circuit, such as an OR-gate 214, to maintain the REFRESH signal 124 in an asserted state while the electronic device 100 is in an operational mode (as indicated by a deassertion of the SUSPEND signal 122) and further to control the state of the REFRESH signal 124 based on the output of the VLFO 202 while the electronic device 100 is in a suspended mode (as indicated by an assertion of the SUSPEND signal 122). In this manner, the deassertion of the SUSPEND signal 122 can override the output of the VLFO 202 so as to ensure that the target circuit 104 is electrically connected to the voltage sources 118 and 120 while in an operational mode. In an alternate configuration, an assertion of the SUSPEND signal 122 can be used to override the RST signal 134 so that the VLFO 202 asserts the REFRESH signal 124 while the electronic device 100 is in the operational mode. Moreover, the state of the SUSPEND signal 122 can be used to selectively connect or disconnect the refresh controller 102 from the power source so as to reduce the power consumed by the refresh controller 102 while the electronic device 100 is in the operational mode.

Figure 3:
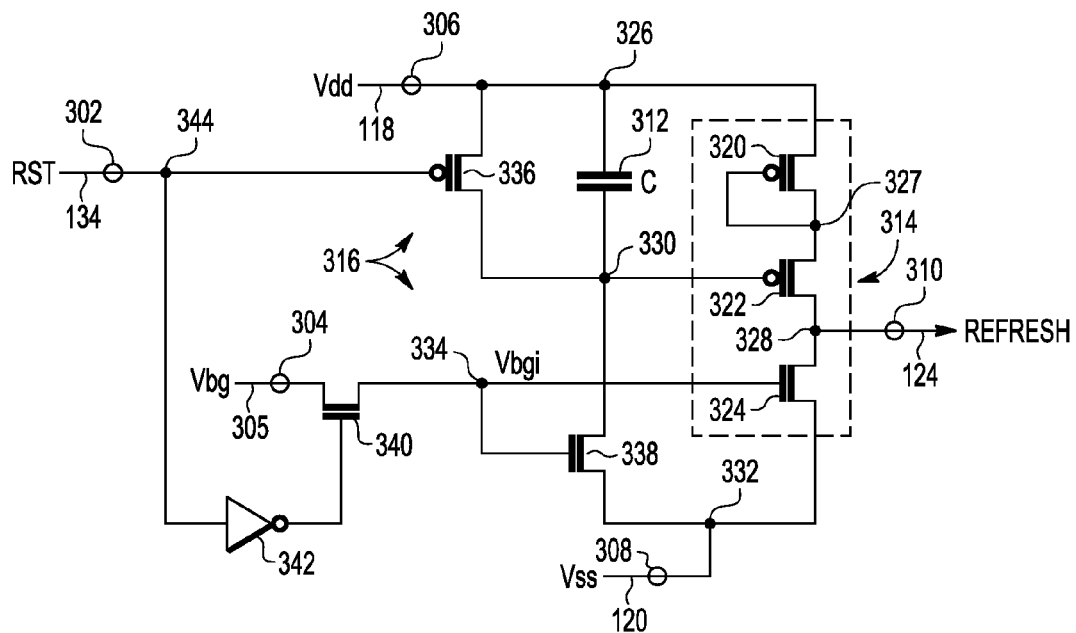
FIG. 3 is a circuit diagram illustrating an example circuit implementation of an oscillator of the refresh controller of FIG. 2 in accordance with at least one embodiment of the present invention.

FIG. 3 illustrates an example implementation of the VLFO 202 of the refresh controller 102 in accordance with at least one embodiment of the present disclosure. In the depicted example, the VLFO 202 includes an input 302 to receive the RST signal 134, an input 304 to receive a bandgap voltage (Vbg) 305 or other stable voltage that is lower than the voltage source 118 and greater than the voltage source 120, an input 306 to receive the voltage source 118, an input 308 to receive the voltage source 120, and an output 310 to provide the REFRESH signal 124. The VLFO 202 further includes a capacitor 312, a level detect circuit 314 to control a state of the REFRESH signal 124 based on a voltage across the capacitor 312, and a capacitor control circuit 316 to control the charging and discharging of the capacitor 312 based on the voltage across the capacitor 312 and the state of the RST signal 134.

In the depicted example, the level detect circuit 314 includes a set of one or more diode-connected transistors 320, a transistor 322, and a transistor 324. The set of one or more diode-connected transistors 320 are connected in series between a node 326 and a node 327, whereby the node 326 is connected to the input 306. The transistor 322 includes a current electrode connected to the node 327, a current electrode connected to a node 328, and a gate electrode connected to a node 330, whereby the node 328 is connected to the output 310. The transistor 324 includes a current electrode connected to the node 328, a current electrode connected to a node 332, and a gate electrode connected to a node 334, whereby the node 332 is connected to the input 308. The capacitor 312 has an electrode connected to the node 326 and an electrode connected to the node 330. The capacitor control circuit 316 includes transistors 336, 338, and 340, and inverter 342. The transistor 336 includes a current electrode connected to the node 326, a current electrode connected to the node 330, and a gate electrode connected to a node 344, whereby the node 344 is connected to the input 302. The transistor 338 includes a current electrode connected to the node 330, a current electrode connected to the node 332, and a gate electrode connected to the node 334. The transistor 340 includes a current electrode connected to the input 304, a current electrode connected to the node 334, and a gate electrode. The inverter 342 includes an input connected to the node 344 and an output connected to the gate electrode of the transistor 340. In the depicted example, the transistors 320, 322, and 336 comprise p-type transistors, the transistors 324, 338, and 340 comprise n-type transistors, and the asserted state of the RST signal 134 is logic "0" or "low."

To facilitate low power consumption, the duration between refresh operations should be sufficiently long to ensure that the average power meets the low power operation requirements. Similarly, to facilitate rapid reentry from the suspended mode to the operational mode, the duration of each refresh operation should be of a length sufficient to refresh the capacitances of the target circuit. In the VLFO configuration of FIG. 3, the duration between refresh operations is controlled by the size of the capacitor 312, the amount of current that can be sourced to the capacitor 312, and the number and threshold of the transistors 320 and 322. The duration of the refresh operation is determined by the frequency of the clock signal 208 and the size of the counter 204 of the refresh duration timing circuit 112. Accordingly, a designer can implement an identified refresh frequency and an identified refresh operation duration through manipulation of one or more of these factors.

Figure 4:
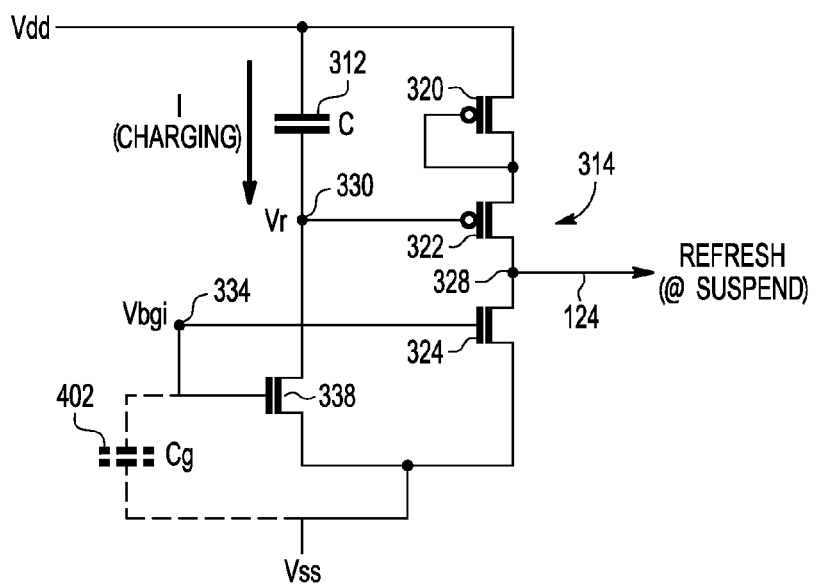
FIG. 4 is a diagram illustrating an effective state of the circuit of FIG. 3 for timing a refresh operation in accordance with at least one embodiment of the present invention.
Figure 5:
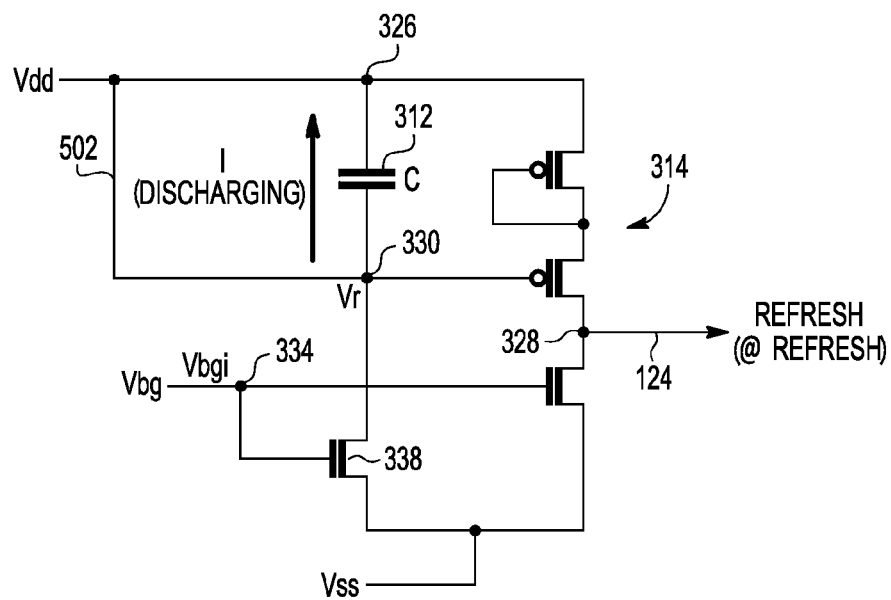
FIG. 5 is a diagram illustrating another effective state of the circuit of FIG. 3 for timing the refresh operation in accordance with at least one embodiment of the present invention.

FIGS. 4 and 5 illustrate the operation of the circuit implementation of the VLFO 202 of FIG. 3. FIG. 4 illustrates the effective state of the circuit of FIG. 3 when the target circuit 104 is in a suspended mode and the RST signal 134 is unasserted. Because the RST signal 134 is unasserted, the transistors 336 and 340 (FIG. 3) are in a non-conductive state. Further, the voltage at node 334 is approximately equal to the voltage Vbg because the gate capacitance 402 of the transistor 338 was charged to a value approximately equal to the voltage Vbg during the previous refresh operation. Accordingly, the capacitor 312 begins charging via a current through transistor 338. Further, the transistors 320, 322, and 324 operate as the level detect circuit 314 that pulls the node 328 (and thus the REFRESH signal 124) to Vdd (that is, asserts the REFRESH signal 124) when the voltage Vr at the node 330 falls below approximately (n*Vth1+Vth2), whereby n represents the number of diode-connected transistors 320 connected in series, Vth1 represents the threshold voltage of the transistors 320, and Vth2 represents the threshold voltage of the transistor 322.

As described above, this assertion of the REFRESH signal 124 marks the start of a refresh operation by temporarily reconnecting the target circuit 104 to the voltage sources 118 and 120 in order to refresh the capacitances of the target circuit 104. The assertion of the REFRESH signal 124 also initiates the timing of the duration of the refresh operation by enabling the counter 204. When the count value 212 of the counter 204 reaches the threshold count value, the one-shot circuit 206 generates a pulse in the RST signal 134. FIG. 5 illustrates the effective state of the circuit of FIG. 3 during the pulse in the RST signal 134. Because the RST signal 134 is asserted (that is, at a logic "0"), the transistor 336 enters a conductive state, as depicted by the closed connection 502 between nodes 326 and 330. The conductive state of the transistor 336 in turn causes the capacitor 312 to discharge, thereby driving the voltage Vr at node 330 to approximately equal to the voltage Vdd at the node 326. Further, the asserted state of the RST signal 134 during the pulse places the transistor 340 into a conductive state, thereby driving the voltage Vbgi at the node 334 to the voltage Vbg. Accordingly, when the voltage Vr rises above the threshold voltage (n*Vth1+Vth2) described above, the level detect circuit 314 pulls the node 328 to the voltage Vss, thereby deasserting the REFRESH signal 124. As described above, the deassertion of the REFRESH signal 124 concludes the refresh operation by disconnecting the target circuit 104 from the voltage sources 118 and 120. When the pulse in the RST signal 134 ends, the effective state of the circuit returns to that depicted in FIG. 3 and timing of the next duration between refresh operations begins with initialization of the charging of capacitor 312 again.

Figure 6:
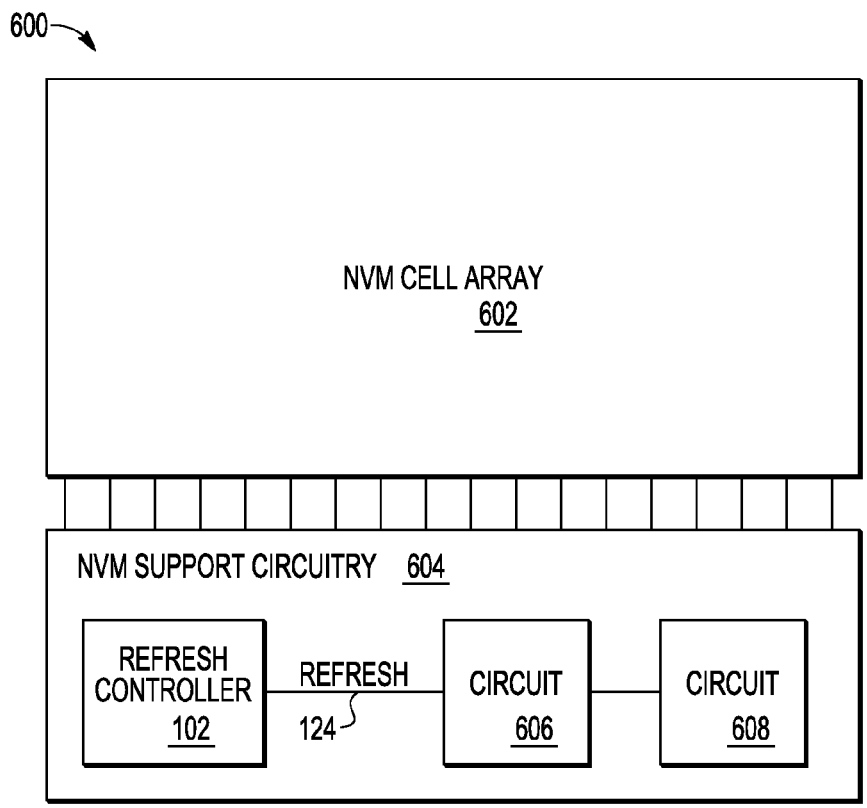
FIG. 6 is a diagram illustrating a non-volatile memory device employing the refresh controller of FIG. 1 in accordance with at least one embodiment of the present invention.

FIG. 6 illustrates an example implementation of the refresh controller 102 in a non-volatile memory (NVM) device 600, such as a flash memory. The NVM device 600 includes a cell array 602 and support circuitry 604 that supports operations for accessing cells of the cell array 602. Due to the intermittent nature of accesses to non-volatile memory, and thus the intermittent operation of the support circuitry 604, the NVM device 600 is well-suited for implementation of the technique of refreshing circuit capacitances during a suspended mode as described above. Accordingly, the support circuitry 604 includes the refresh controller 102 and a plurality of circuits, such as circuits 606 and 608, selectively connected and disconnected from one or more voltage sources (not shown) based on the REFRESH signal 124 provided by the refresh controller 102. The circuits 606 and 608 can include, for example, sense amplifiers, line drivers, current mirrors, and the like. Although FIG. 6 illustrates a particular implementation in a non-volatile memory device, the refresh technique described above is not limited to this example, but instead may be implemented in any of a variety of electronic devices capable of implementing a low power mode.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A method comprising:
   configuring a circuit into a suspended mode by disconnecting the circuit from at least one voltage source;
   initiating a charging of a capacitor of a refresh controller coupled to the circuit;
   initiating a refresh operation of the circuit responsive to a voltage across the capacitor of the refresh controller exceeding a threshold voltage, the refresh operation initiated during the suspended mode to recharge at least one capacitance of the circuit by temporarily reconnecting the circuit to the at least one voltage source; and
   ending the refresh operation in response to the voltage across the capacitor of the refresh controller being below the threshold voltage.

2. The method of claim 1, wherein a timing of the refresh operation further comprises:
   initiating a counter responsive to initiating the refresh operation; and
   terminating the refresh operation responsive to the counter reaching a count threshold.

3. The method of claim 2, further comprising:
   initiating a discharging of the capacitor responsive to the counter reaching the count threshold.

4. The method of claim 1, wherein initiating the charging of the capacitor comprkes initiating the charging of the capacitor responsive to configuring the circuit into the suspended mode.

5. The method of claim 1, wherein initiating the charging of the capacitor comprises initiating the charging of the capacitor responsive to terminating a previous refresh operation for the circuit.

6. The method of claim 1, wherein the timing of the refresh operation further comprises:
   setting a refresh signal for the refresh operation based on a state of a node coupled between two transistors of a level detect circuit, wherein the level detect circuit detects the voltage across the capacitor.

7. An electronic device comprising:
   a target circuit configurable into a suspended mode by disconnecting a node of the target circuit from a voltage source; and
   a refresh controller to control a refresh operation to recharge at least one capacitance of the target circuit during the suspended mode by temporarily reconnecting the target circuit to the voltage source, wherein the refresh operation is initiated in response to a voltage across a capacitor of the refresh controller exceeding a threshold voltage during a charging of the capacitor, and wherein the refresh operation is ended in response to the voltage across the capacitor of the refresh controller dropping below the threshold voltage.

8. The electronic device of claim 7, wherein the refresh controller comprises:
   a refresh duration timing circuit to initiate a counter responsive to initiation of the refresh operation and to terminate the refresh operation responsive to a count value of the counter reaching a count threshold; and
   a refresh initialization timing circuit to initiate a discharging of the capacitor responsive to the count value reaching the count threshold.

9. The electronic device of claim 8, wherein the refresh initialization timing circuit initiates the charging of the capacitor responsive to at least one of: configuring the target circuit into the suspended mode or terminating a prior refresh operation for the target circuit.

10. The electronic device of claim 8, wherein the refresh initialization timing circuit comprises an oscillator, the oscillator comprising:
    the capacitor;
    a level detect circuit to control a state of a refresh signal based on the voltage across the capacitor, wherein the target circuit is selectively connected to or disconnected from the voltage source based on a state of the refresh signal; and
    a capacitor control circuit to selectively charge or discharge the capacitor responsive to a state of a reset signal received from the refresh duration timing circuit.

11. The electronic device of claim 10, wherein the refresh duration timing circuit comprises:
    the counter having an input to receive the refresh signal, an input to receive a clock signal, and an output to provide the count value, the counter to initiate modification of the count value responsive to the refresh signal and based on the clock signal; and
    a reset circuit to control the state of the reset signal based on the count value.

12. The electronic device of claim 11, wherein:
    the reset circuit comprises a one-shot circuit to generate a pulse in the reset signal responsive to the count value reaching the count threshold; and
    the capacitor control circuit is to initiate a discharging of the capacitor responsive to the pulse in the reset signal.

13. The electronic device of claim 7, further comprising:
    a non-volatile memory comprising the target circuit.

14. The electronic device of claim 7, wherein the refresh controller comprises:
    the capacitor comprises a first electrode coupled to a first node and a second electrode coupled to a second node, the first node coupled to a first voltage source; and
    a level detect circuit comprises:
        a set of one or more diode-connected transistors connected in series between the first node and a third node;
        a first transistor having a first current electrode coupled to the third node, a second current electrode coupled to a fourth node, and a gate electrode coupled to the second node, wherein a refresh signal for the refresh operation is based on a state of the fourth node; and
        a second transistor having a first current electrode coupled to the fourth node, a second current electrode coupled to a second voltage source, and a gate electrode coupled to a fifth node.

15. An electronic device comprising:
    an output coupleable to a switch of a target circuit, the output to provide a refresh signal to selectively connect or disconnect the target circuit from a voltage source using the switch;
    an oscillator comprising:
        a capacitor;
        a level detect circuit to assert a high voltage state of the refresh signal in response on a voltage across the capacitor being above a threshold voltage, and to assert a low voltage state of the refresh signal in response to the voltage across the capacitor being below the threshold level; and a capacitor control circuit to selectively charge or discharge the capacitor responsive to a state of a reset signal;

a counter comprising an input to receive the refresh signal, an input to receive a clock signal, and an output to provide a count value, wherein the counter is to initiate modification of the count value responsive to the refresh signal and based on the clock signal; and a reset circuit to control the state of the reset signal based on the count value.

16. The electronic device of claim 15, wherein:

the reset circuit comprises a one-shot circuit to generate a pulse in the reset signal responsive to the count value reaching a count threshold; and the capacitor control circuit is to initiate a discharging of the capacitor responsive to the pulse in the reset signal.

17. The electronic device of claim 15, wherein:

the capacitor comprises a first electrode coupled to a first node and a second electrode coupled to a second node, the first node coupled to a first voltage source;

the level detect circuit comprises:

a set of one or more diode-connected transistors connected in series between the first node and a third node;

a first transistor having a first current electrode coupled to the third node, a second current electrode coupled to a fourth node, and a gate electrode coupled to the second node, wherein the refresh signal is based on a state of the fourth node; and a second transistor having a first current electrode coupled to the fourth node, a second current electrode coupled to a second voltage source, and a gate electrode coupled to a fifth node.

18. The electronic device of claim 17, wherein the capacitor control circuit comprises:

a third transistor having a first current electrode coupled to the second node, a second current electrode coupled to the second voltage source, and a gate electrode coupled to the fifth node;

a fourth transistor having a first current electrode coupled to a third voltage source, a second current electrode coupled to the fifth node, and a gate electrode to receive a representation of the reset signal; and a fifth transistor having a first current electrode coupled to the first node, a second current electrode coupled to the second node, and a gate electrode to receive a representation of the reset signal.

19. The electronic device of claim 18, wherein:

the set of one or more diode-connected transistors, the first transistor and the fifth transistor comprise p-type transistors;

the second transistor, the third transistor, and the fourth transistor comprise n-type transistors; and the capacitor control circuit further comprises an inverter having an input to receive the reset signal and an output coupled to the gate electrode of the fourth transistor.

20. The electronic device of claim 15, further comprising:

a non-volatile memory comprising the target circuit.

* * * * *